United States Patent
Tsai et al.

(10) Patent No.: US 8,575,004 B2
(45) Date of Patent: Nov. 5, 2013

(54) LIFT-OFF STRUCTURE FOR SUBSTRATE OF A PHOTOELECTRIC DEVICE AND THE METHOD THEREOF

(75) Inventors: Yu-Li Tsai, Taoyuan County (TW); Chih-Hung Wu, Taoyuan County (TW); Jei-Li Ho, Taoyuan County (TW); Chao-Huei Huang, Taoyuan County (TW); Min-De Yang, Taoyuan County (TW)

(73) Assignee: Institute of Nuclear Energy Research Atomic Energy Council, Executive Yuan, Taoyuan County (TW)

( * ) Notice: Subject to any disclaimer, the term of this patent is extended or adjusted under 35 U.S.C. 154(b) by 97 days.

(21) Appl. No.: 13/273,520

(22) Filed: Oct. 14, 2011

(65) Prior Publication Data

US 2012/0273815 A1  Nov. 1, 2012

(30) Foreign Application Priority Data

Apr. 29, 2011  (TW) .................................. 100115090

(51) Int. Cl.
*H01L 21/30* (2006.01)
*H01L 21/46* (2006.01)

(52) U.S. Cl.
USPC ............. 438/458; 438/33; 438/460; 438/604; 438/481; 257/E21.025; 257/E21.034; 257/E21.235; 257/E21.587

(58) Field of Classification Search
USPC ................... 438/33, 458, 460, 604, 745, 481; 257/E21.025, E21.034, E21.235, 257/E21.587
See application file for complete search history.

(56) References Cited

U.S. PATENT DOCUMENTS

2007/0194337 A1* 8/2007 Kondo ............................ 257/98
2010/0102419 A1* 4/2010 Pan ............................... 257/653

* cited by examiner

*Primary Examiner* — Michelle Mandala
(74) *Attorney, Agent, or Firm* — WPAT, PC; Justin King

(57) ABSTRACT

The present invention related to a lift-off structure adapted to a substrate having a photoelectric device, the structure comprising: a buffer layer, forming on the substrate; an upper sacrificial layer, forming on the buffer layer; an etch stop layer, forming on the upper sacrificial layer, and the photoelectric device structure forming on the etch stop layer.

7 Claims, 7 Drawing Sheets

LIFT-OFF STRUCTURE FOR SUBSTRATE OF A PHOTOELECTRIC DEVICE AND THE METHOD THEREOF

FIELD OF THE INVENTION

The present invention relates to a lift-off structure for substrate of a photoelectric device and the method thereof, and more particularly, to a lift-off process adapted for semiconductor and photoelectric industries.

BACKGROUND OF THE INVENTION

Generally speaking, under concentrated-light operation condition, III-V multi-junction solar cell can absorb solar energy in a wider wavelength range and as a result its photoelectric conversion efficiency, that is about 43% in laboratory test, is higher than the usual flat-plate solar cell. Hence, the III-V multi-junction solar cells are especially suitable to be applied in large ground-mounted solar power systems for providing electricity in residential sector. Operationally, the electricity output of a solar cell is influenced by the intensity of the light that shines on it while the electricity output of the solar cell can be fed to and used by an external device through its metal electrodes. In a condition when a solar cell is operating especially under concentrated-light operation condition, there will be an electric current of several amperes or more flowing through the components inside the solar cell, and consequently, if there is any components inside the solar cell that is designed with poor heat dissipating ability in view of thermal resistance, the temperature of such component as well as the whole solar cell will raise after light shines on the solar cell, causing the conversion efficiency of the solar cell to deteriorate, i.e. the current-voltage characteristics of the solar cell are adversely affected.

Conventionally, for improving the thermal conducting ability of a GaAs-based solar cell, the solar cell that is formed on a raw GaAs substrate is first being attached to an adhesive layer of a metal substrate that is formed with high heat-dissipating ability by wafer bonding, and then a chemical solution, such as a mixing solution of ammonia, hydrogen peroxide and water, is used for etching the raw GaAs substrate so as to prepare the same for having a layer of metallic electrode grids to be formed therein, as shown in FIG. 1. Thereby, a structure of a solar cell attaching to a metal substrate with high heat-dissipating ability is achieved.

As the raw GaAs substrate will be etching away by the chemical solution in the aforesaid conventional solar cell manufacturing process, thus such manufacturing process is disadvantageous in that: first, the raw substrate can not be recycled and used repetitively; and second, the manufacturing cost is increased comparing with those solar cells without the metal substrate with high heat-dissipating ability, owing to the acquisition costs of the raw substrate and the metal substrate with high heat-dissipating ability, and the waste management cost for treating the arsenic-containing waste liquid resulting from the manufacturing process.

Conventionally, in order to overcome the aforesaid shortcomings, a prior-art technique is provided, in which the raw substrate is separated from the solar cell and thus removed by the selectively etching of a sacrificial layer using a chemical solution. However, since such etching of the sacrificial layer can only be performed starting from the lateral of a wafer used for forming solar cells, the lateral etching rate of the sacrificial layer can be very low due to the restriction of capillary action and the limitation relating to a minimum contact area. Therefore, it can take a very long period of time just for performing a substrate lift-off process upon a large-size wafer. Thus, such prior-art technique for separating the raw substrate might not be feasible for industrial mass production.

SUMMARY OF THE INVENTION

In view of the disadvantages of prior art, the object of the present invention is to provide a lift-off structure for substrate of a photoelectric device and the method thereof, by that not only the etching contact area can be increased effectively, but also the adverse effect of capillary action can be improved by the proper etching channel design used in the present invention.

In an embodiment, the present invention provides a lift-off structure, adapted for a substrate having a photoelectric element formed thereon, which comprises:
 a buffer layer, formed on the substrate;
 an upper sacrificial layer, formed on the buffer layer;
 an etch stop layer, formed on the upper sacrificial layer, and being made of a quaternary III-phosphide or ternary III-phosphide, such as GaInP, AlInP, AlGaInP; and
 the photoelectric element, formed on the etch stop layer.

In another embodiment, the present invention provides a lift-off structure, adapted for a substrate having a photoelectric element formed thereon, which comprises:
 a buffer layer, formed on the substrate, and being made of GaAs;
 an etch stop layer, formed on the buffer layer;
 a lower sacrificial layer, formed on the etch stop layer; and
 the photoelectric element, formed on the lower sacrificial layer.

Preferably, the substrate can be made of GaAs, the buffer layer also can be made of GaAs, whereas the upper sacrificial layer can substantially be a semiconductor layer made of a material of high aluminum content, such as $Al_xGa_{1-x}As$, $0.5 \leq x \leq 1$. Similarly, the lower sacrificial layer can substantially be a semiconductor layer made of a material of high aluminum content, such as $Al_xGa_{1-x}As$, $0.5 \leq x \leq 1$. In addition, the etch stop layer can be made of a quaternary III-phosphide or ternary III-phosphide, such as GaInP, AlInP, AlGaInP; and the photoelectric element can substantially be a solar cell, a light-emitting diode, or a p-n junction device.

Moreover, in further another embodiment, the present invention provides a lift-off method, adapted for a substrate having a photoelectric element formed thereon, which comprises the steps of:
 providing a lift-off structure to be arranged between the substrate and the photoelectric element;
 forming an adhesive layer on the photoelectric element while enabling the adhesive layer to be formed with a plurality of patterns to be used for defining a plurality of chips as each pattern is formed the same as its corresponding chip in size; the adhesive layer can be formed using a method selected from the group consisting of: a thermal evaporation method, an electron beam evaporation method, a sputtering deposition method, an electroplating method, an electroless deposition method and a screen printing method;
 using an etching solution to perform an etching operation respectively upon the patterns formed on the adhesive layer while enabling channels to be formed between neighboring chips by the etching of the etch solution;
 bonding a substrate with high heat-dissipating ability on the adhesive layer so as to form a wafer, whereas the substrate with high heat-dissipating ability can be made of a material selected from the group consisting of: gold, silver, copper, aluminum, zinc, copper-zinc alloy, aluminum-magnesium alloy, stainless steel, molybdenum, and silicon;

sinking the wafer into a hydrofluoric acid-containing etching solution for enabling an epitaxial lift-off process to be performed thereupon until a sacrificial layer of the lift-off structure to be etched away completely by the hydrofluoric acid-containing etching solution and thus the substrate is separate from the wafer;

using a chemical solution to remove a etch stop layer of the lift-off structure and then forming a plurality of metal electrodes on the photoelectric element; and performing a dicing operation upon the wafer using a means selected from the group consisting of: a laser dicing means and a precision cutting means.

It is noted that the time required for the foregoing substrate lift-off method to perform is irrelevant to the size of the wafer to be processed, but rather is primarily determined by the size of the chips that are defined and formed in the process. Substantially, the required time is about equal to the value of the half of the chip size divided by the lateral etching rate of the sacrificial layer. Taking the processing of a 4-inch wafer with 3 mm x 3 mm chips for instance, the processing time of the present invention is about 30 times shorter than those conventional method so that the substrate lift-off method can be adapted for industrial mass production.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
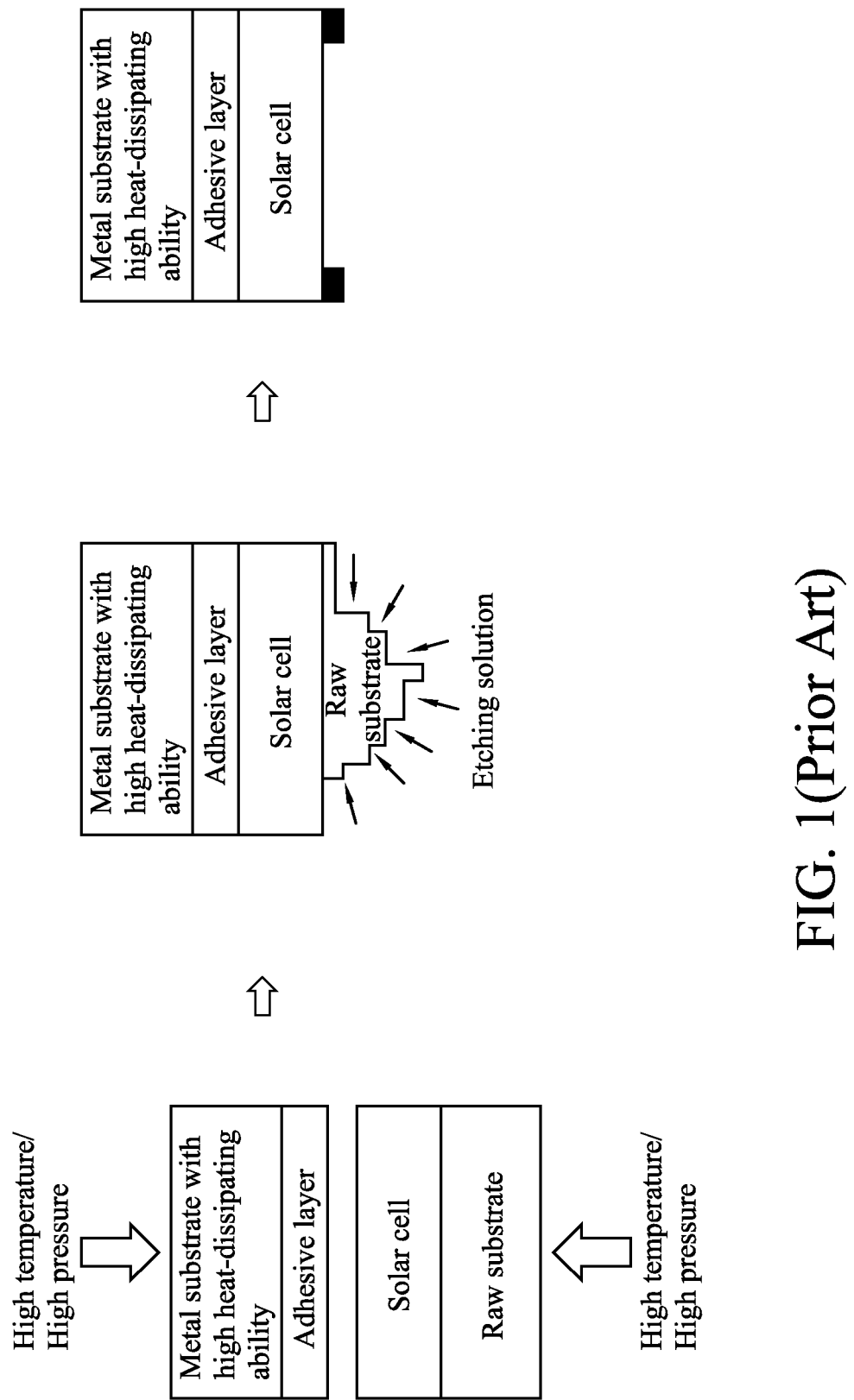
FIG. 1 is a schematic diagram showing a conventional lift-off method.
Figure 2A:
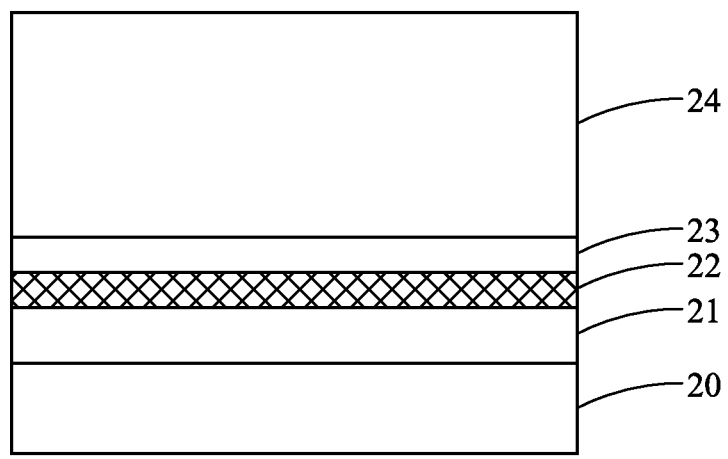
FIG. 2A is a schematic diagram showing a lift-off structure for substrate of a photoelectric device according to a first embodiment of the invention.

Please refer to FIG. 2A, which is a schematic diagram showing a lift-off structure for substrate of a photoelectric device according to a first embodiment of the invention. In FIG. 2A, the present invention provides a lift-off structure, adapted for a substrate 20 having a photoelectric element 24 formed thereon, which comprises: a buffer layer 21, formed on the substrate 20, and being made of GaAs; an upper sacrificial layer 22, formed on the buffer layer 21, and being made of a material of high aluminum content, such as $Al_xGa_{1-x}As$, $0.5 \leq x \leq 1$; an etch stop layer 23, formed on the upper sacrificial layer 22, and being made of a quaternary III-phosphide or ternary III-phosphide, such as GaInP, AlInP, AlGaInP; and the photoelectric element 24, formed on the etch stop layer 23; wherein the substrate 20 can be made of GaAs; and the photoelectric element 24 can substantially be a device selected from the group consisting of: a solar cell, a light-emitting diode, and a p-n junction device.

Figure 2B:
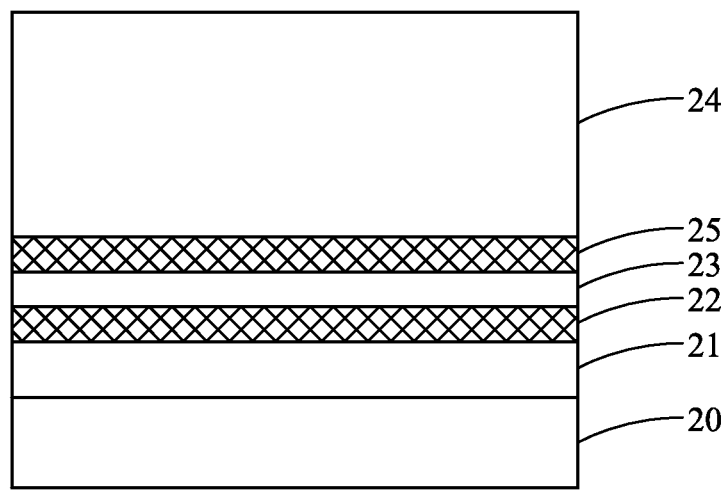
FIG. 2B is a schematic diagram showing a lift-off structure for substrate of a photoelectric device according to a second embodiment of the invention.

Please refer to FIG. 2B, which is a schematic diagram showing a lift-off structure for substrate of a photoelectric device according to a second embodiment of the invention. In FIG. 2B, the present invention provides a lift-off structure, adapted for a substrate 20 having a photoelectric element 24 formed thereon, which comprises: a buffer layer 21, formed on the substrate 20, and being made of GaAs; an upper sacrificial layer 22, formed on the buffer layer 21, and being made of a material of high aluminum content, such as $Al_xGa_{1-x}As$, $0.5 \leq x \leq 1$; an etch stop layer 23, formed on the upper sacrificial layer 22, and being made of a quaternary III-phosphide or ternary III-phosphide, such as GaInP, AlInP, AlGaInP; a lower sacrificial layer 25, formed on the etch stop layer 23, and being made of a material of high aluminum content, such as $Al_xGa_{1-x}As$, $0.5 \leq x \leq 1$; and the photoelectric element 24, formed on the lower sacrificial layer 25, being substantially a device selected from the group consisting of: a solar cell, a light-emitting diode, and a p-n junction device.

Figure 2C:
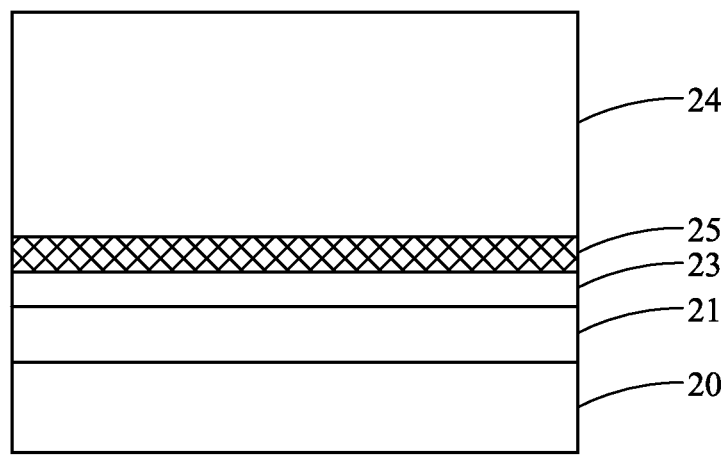
FIG. 2C is a schematic diagram showing a lift-off structure for substrate of a photoelectric device according to a third embodiment of the invention.

Please refer to FIG. 2C, which a schematic diagram showing a lift-off structure for substrate of a photoelectric device according to a third embodiment of the invention. In FIG. 2C, the present invention provides a lift-off structure, adapted for a substrate 20 having a photoelectric element 24 formed thereon, which comprises: a buffer layer 21, formed on the substrate 20, and being made of GaAs; an etch stop layer 23, formed on the buffer layer 21, and being made of a quaternary III-phosphide or ternary III-phosphide, such as GaInP, AlInP, AlGaInP; a lower sacrificial layer 25, formed on the etch stop layer 23, and being made of a material of high aluminum content, such as $Al_xGa_{1-x}As$, $0.5 \le x \le 1$; and the photoelectric element 24, formed on the lower sacrificial layer 25; wherein the substrate 20 can be made of GaAs; and the photoelectric element 24 can substantially be a device selected from the group consisting of: a solar cell, a light-emitting diode, and a p-n junction device.

Figure 3:
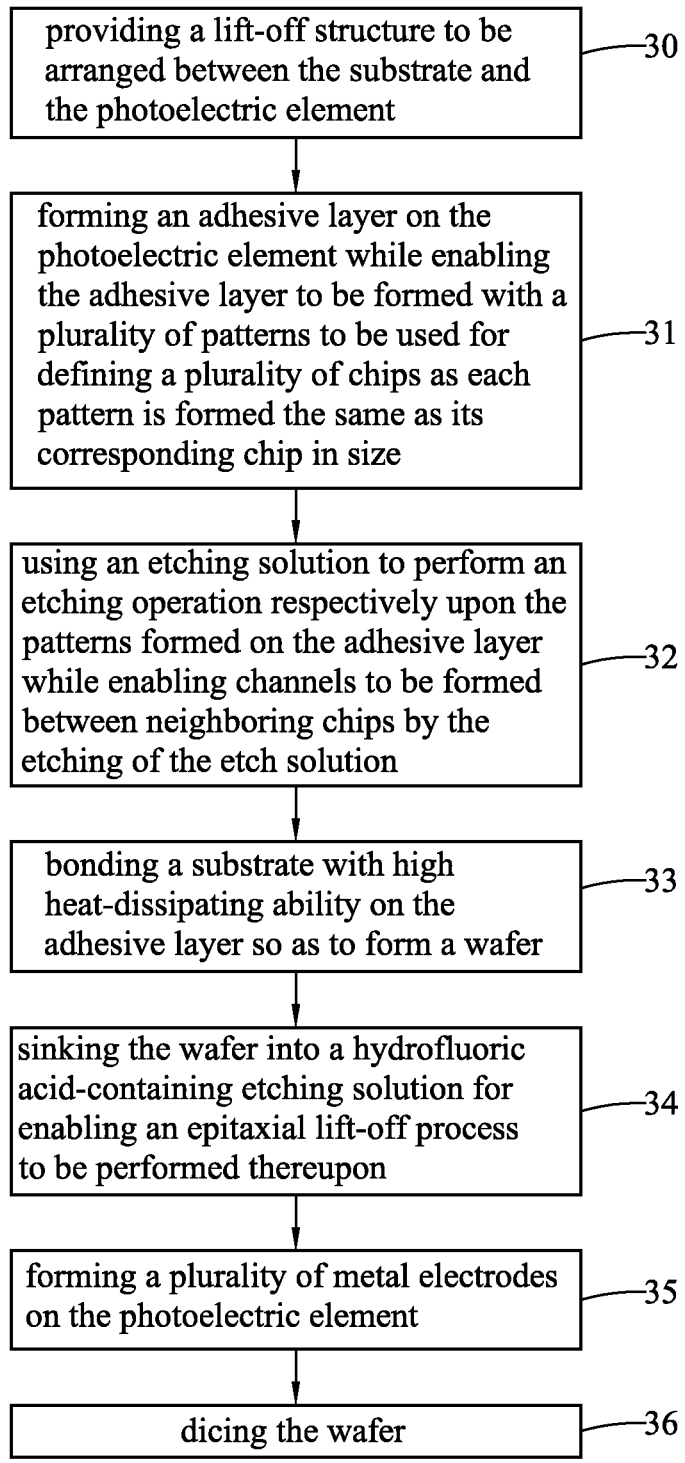
FIG. 3 is a schematic diagram showing a lift-off method for substrate of a photoelectric device according to an embodiment of the invention.
Figure 4A:
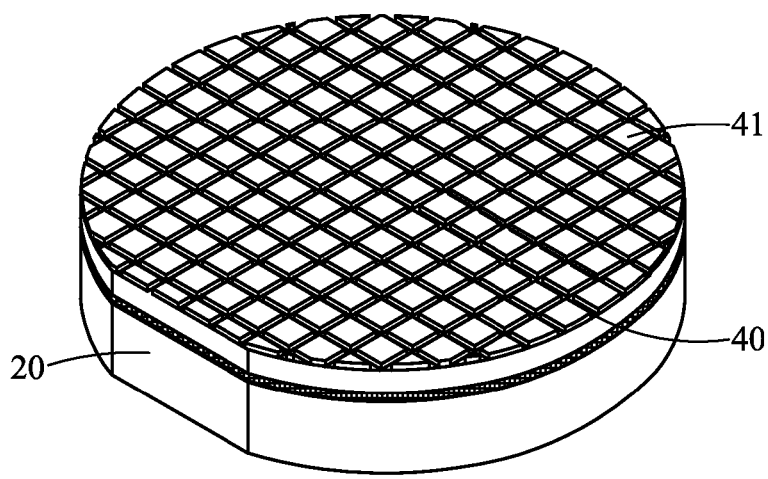
FIG. 4A is a schematic diagram showing a step for forming an adhesive layer while enabling the adhesive layer to be formed with a plurality of patterns for defining a plurality of chips that is performed in a lift-off method of the present invention.

Please refer to FIG. 3, which is a schematic diagram showing a lift-off method for substrate of a photoelectric device according to an embodiment of the invention. It is noted that the lift-off method of the invention is adapted for a substrate 20 having a photoelectric element 24 formed thereon. The lift-off method of the present invention starts from step 30. At step 30, a lift-off structure is provided at a position between the substrate 20 and the photoelectric element 24; and then the flow proceeds to step 31. At step 31, an adhesive layer 40 is formed on the photoelectric element 24 while enabling the adhesive layer 40 to be formed with a plurality of patterns to be used for defining a plurality of chips 41 as each pattern is formed the same as its corresponding chip in size; and then the flow proceeds to step 32. Moreover, the adhesive layer 40 can be formed using a method selected from the group consisting of: a thermal evaporation method, an electron beam evaporation method, a sputtering deposition method, an electroplating method, an electroless deposition method and a screen printing method, as shown in FIG. 4A.

Figure 4B:
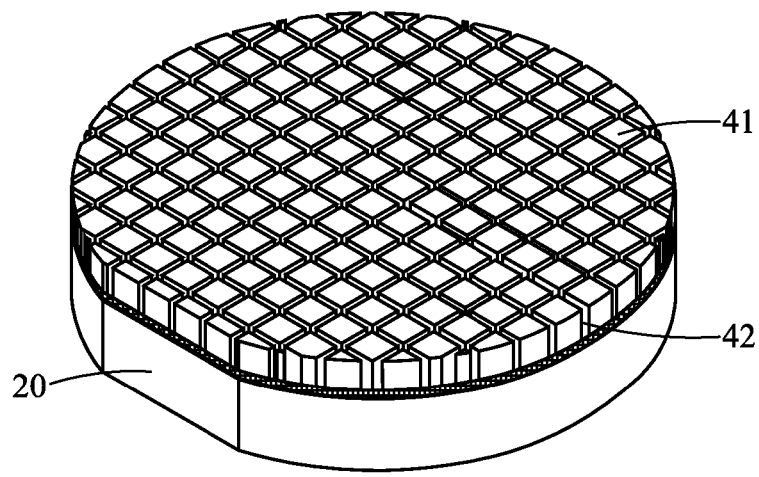
FIG. 4B is a schematic diagram showing a step for etching the patterns formed on the adhesive layer that is performed in a lift-off method of the present invention.

At step 32, an etching solution is used for perform an etching operation respectively upon the patterns formed on the adhesive layer 40 while enabling channels 42 to be formed between neighboring chips 41 to a depth reaching the sacrificial layer by the etching of the etch solution; and then the flow proceeds to step 33. It is noted that by etching each of the channels 42 with sufficient width and depth, not only the etching contact area can be increased effectively, but also the adverse affect of capillary action can be improved, as shown in FIG. 4B.

Figure 4C:
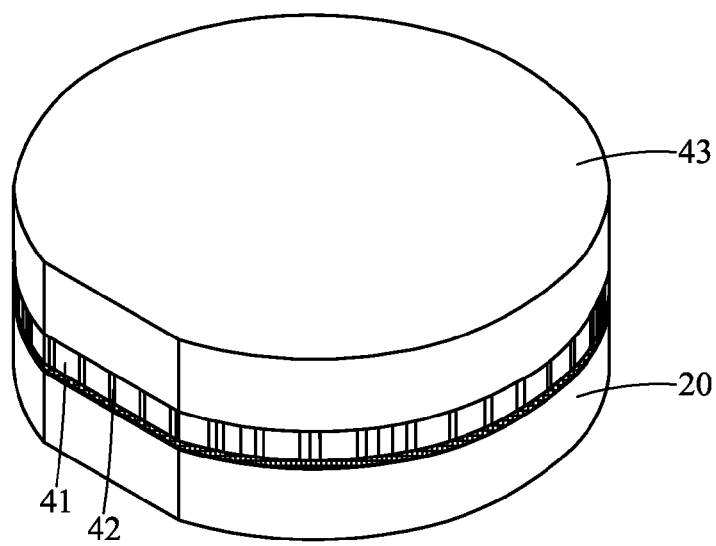
FIG. 4C is a schematic diagram showing a step for bonding a substrate with high heat-dissipating ability on the adhesive layer so as to form a wafer that is performed in a lift-off method of the present invention.

At step 33, a substrate with high heat-dissipating ability 43 is bonded onto the adhesive layer 40 so as to form a wafer, as shown in FIG. 4C; and then the flow proceeds to step 34. It is noted that the substrate with high heat-dissipating ability 43 can be made of a material selected from the group consisting of: gold, silver, copper, aluminum, zinc, copper-zinc alloy, aluminum-magnesium alloy, stainless steel, molybdenum, and silicon.

Figure 4D:
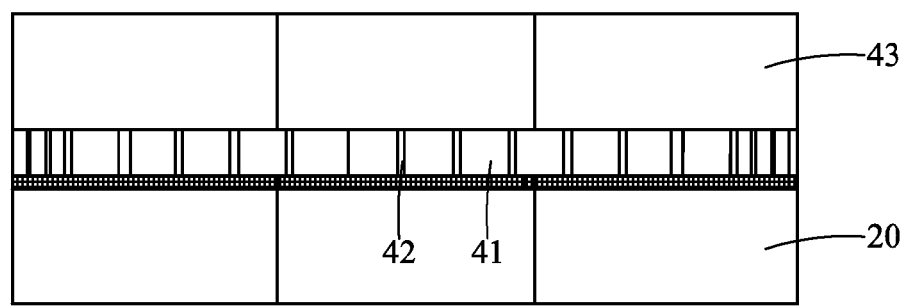
FIG. 4D is a schematic diagram showing a step for sinking the wafer into a HF-containing etching solution for enabling an epitaxial lift-off process to be performed thereupon so as to separate the substrate from the wafer that is performed in a lift-off method of the present invention.
Figure 4E:
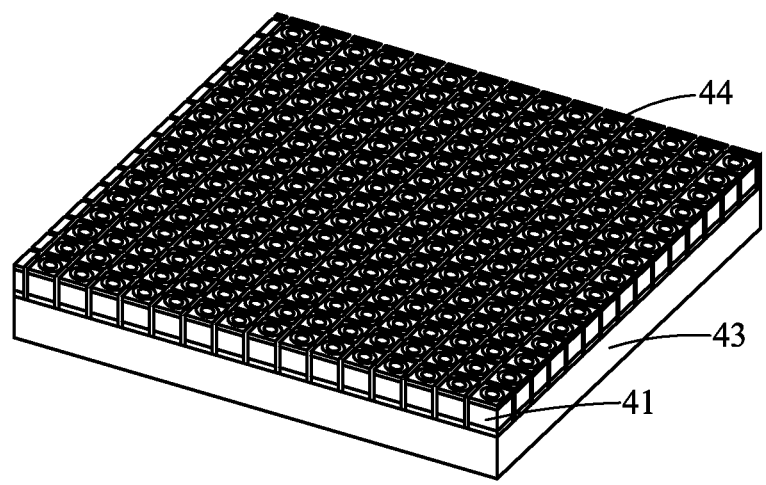
FIG. 4E is a schematic diagram showing a step for forming a plurality of metal electrodes on the photoelectric element that is performed in a lift-off method of the present invention.

At step 34, as shown in FIG. 4D, the wafer is sunk into a hydrofluoric acid (HF)-containing etching solution for enabling an epitaxial lift-off process to be performed thereupon until a sacrificial layer of the lift-off structure to be etched away completely by the hydrofluoric acid-containing etching solution and thus the substrate 20 is separated from the wafer; and then the flow proceeds to step 35. At step 35, a plurality of metal electrodes 44 is formed on the photoelectric element, as shown in FIG. 4E; and then the flow proceeds to step 36.

At step 36, the wafer is diced using a means selected from the group consisting of: a laser dicing means and a precision cutting means. In a condition when the substrate with high heat-dissipating ability 43 is made of a metal with good ductility and malleability, the wafer should be diced using a laser dicing means. On the other hand, when the substrate with high heat-dissipating ability 43 is made of silicon, the wafer should be diced using a precision cutting means.

Figure 5:
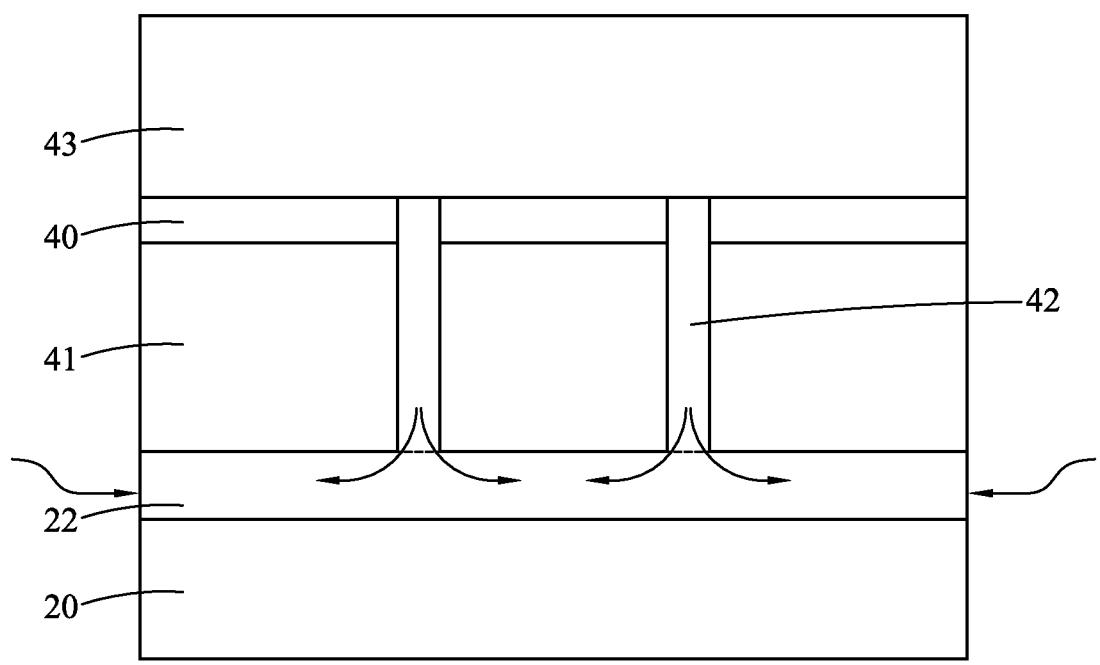
FIG. 5 is a schematic diagram showing how the etching solution can overcome the capillary action so as to be fed into channels for etching the sacrificial layer in the present invention.

Please refer to FIG. 5, which is a schematic diagram showing how the etching solution can overcome the capillary action so as to be fed into channels for etching the sacrificial layer in the present invention. As shown in FIG. 5, by forming the channels with sufficient widths and depths between neighboring chips 41, the etching solution can overcome the capillary action so as to be fed into channels for etching the sacrificial layer 22, and consequently, the etching rate can be improved due to the increasing of the etching contact area.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A lift-off method, adapted for a substrate having a photoelectric element formed thereon, which comprises the steps of:
   providing a lift-off structure to be arranged between the substrate and the photoelectric element;
   forming an adhesive layer on the photoelectric element while enabling the adhesive layer to be formed with a plurality of patterns to be used for defining a plurality of chips as each pattern is formed the same as its corresponding chip in size;
   using an etching solution to perform an etching operation respectively upon the patterns formed on the adhesive layer;
   bonding a substrate with high heat-dissipating ability on the adhesive layer so as to form a wafer;
   sinking the wafer into an etching solution for enabling an epitaxial lift-off process to be performed thereupon;
   forming a plurality of metal electrodes on the photoelectric element; and
   dicing the wafer.

2. The lift-off method of claim 1, wherein the photoelectric element is substantially a device selected from the group consisting of: a solar cell, a light-emitting diode, and a p-n junction device.

3. The lift-off method of claim 1, wherein the adhesive layer is made of al least one material selected from the group consisting of: gold, silver, copper, nickel, chromium, palladium, titanium, tin, zinc, and germanium.

4. The lift-off method of claim 1, wherein the adhesive layer is formed using a method selected from the group consisting of: a thermal evaporation method, an electron beam evaporation method, a sputtering deposition method, an electroplating method, an electroless deposition method and a screen printing method.

5. The lift-off method of claim 1, wherein the substrate with high heat-dissipating ability is made of a material selected from the group consisting of: gold, silver, copper, aluminum, zinc, copper-zinc alloy, aluminum-magnesium alloy, stainless steel, molybdenum, and silicon.

6. The lift-off method of claim 1, wherein each of the metal electrodes is made of a material selected from the group consisting of: gold, silver, copper, nickel, chromium, palladium, titanium, tin, zinc, and germanium.

7. The lift-off method of claim 1, wherein the dicing of the wafer is performed using a means selected from the group consisting of: a laser dicing means and a precision cutting means.

* * * * *